United States Patent [19]
Krishna et al.

[11] Patent Number: 5,571,373
[45] Date of Patent: Nov. 5, 1996

[54] METHOD OF ROUGH POLISHING SEMICONDUCTOR WAFERS TO REDUCE SURFACE ROUGHNESS

[75] Inventors: Vepa Krishna, St. Charles; Michael S. Wisnieski, O'Fallon; Lois Illig, Troy, all of Mo.

[73] Assignee: MEMC Electronic Materials, Inc., St. Peters, Mo.

[21] Appl. No.: 245,592

[22] Filed: May 18, 1994

[51] Int. Cl.⁶ .................................................. C03C 25/06
[52] U.S. Cl. .......................................... 156/636.1; 216/89
[58] Field of Search ........................... 156/636.1, 645.1; 216/88, 89

[56] References Cited

U.S. PATENT DOCUMENTS

| | | | |
|---|---|---|---|
| 3,170,273 | 2/1965 | Walsh et al. | 51/281 |
| 4,968,381 | 11/1990 | Prigge et al. | 156/636 |
| 5,032,203 | 7/1991 | Doy et al. | 156/345 |
| 5,297,361 | 3/1994 | Baldy et al. | 51/119 |
| 5,376,222 | 12/1994 | Miyajima et al. | 156/636 |
| 5,383,993 | 1/1995 | Katada et al. | 156/153 |

FOREIGN PATENT DOCUMENTS 3001535  1/1991  Japan.

*Primary Examiner*—Robert Kunemund
*Assistant Examiner*—Anita Alanko
*Attorney, Agent, or Firm*—Senniger, Powers, Leavitt & Roedel

[57] ABSTRACT

A method of rough polishing a semiconductor wafer to reduce roughness on a surface of the wafer prior to finish polishing the wafer by applying a polishing solution to a polishing material, contacting the polishing material and the polishing solution with the surface of the wafer as the wafer moves relative to the polishing material to reduce low frequency surface roughness of the wafer, applying a second polishing solution to the polishing material, and contacting the polishing material and the second polishing solution with the surface of the wafer as the wafer moves relative to the polishing material to further reduce the low frequency surface roughness, wherein the wafer has an average surface roughness not greater than 1.0 nm Ra, as measured on a 1 mm×1 mm scan with an optical interferometer, after being rough polished.

37 Claims, 3 Drawing Sheets

METHOD OF ROUGH POLISHING SEMICONDUCTOR WAFERS TO REDUCE SURFACE ROUGHNESS

BACKGROUND OF THE INVENTION

The present invention relates generally to methods of rough polishing semiconductor wafers. The invention particularly relates to a method of rough polishing silicon wafers to reduce the surface roughness of the wafers.

Polished semiconductor wafers are prepared from a single crystal ingot which undergoes trimming and orientation flattening prior to slicing the ingot into individual wafers. The edges of the wafers are rounded to avoid wafer damage during further processing. The wafers are then treated with an abrasive slurry (lapped) to remove surface damage induced by the slicing process and to make the opposed surfaces of each wafer flat and parallel. After the lapping process, the wafers are subjected to chemical etching to remove mechanical damage produced by the prior shaping steps. At least one surface of each wafer is polished with a colloidal silica slurry and a chemical etchant to ensure that the wafer has a highly reflective, damage-free surface. The wafers are then cleaned and inspected prior to being packaged.

Silicon wafers are typically polished using a two step method of rough polishing for stock removal followed by finish polishing to reduce nonspecularly reflected light (haze). An unpolished wafer includes high and low frequency components of roughness on its surface. The high frequency roughness causes high light scatter from the surface due to haze. The rough polishing and subsequent finish polishing stages minimize the high and low frequency surface roughness and reduce haze.

A silicon wafer is prepared for polishing by wax bonding the wafer to a ceramic polishing block which is then mounted on the arm of the polisher apparatus. The polisher includes a ceramic turntable which is overlaid with a hard polyurethane impregnated felt pad. In a typical two step polishing process, the polisher arm is lowered onto the pad and the turntable is rotated while a sodium stabilized colloidal silica slurry and an alkaline etchant are dispensed onto the pad surface. The surface of the wafer is rough polished for eight to ten minutes to remove 15–20 μm of silicon (Si <100>) from the surface of the wafer.

The polishing is achieved through a combination of pressure, temperature, mechanical abrasive force and chemical reaction. The colloidal abrasive and the pressure applied to the silicon wafer (about nine lb/in$^2$ of silicon surface exposed) elevate the temperature to 50° to 55° C. to facilitate the chemical reaction, while the alkaline etchant accelerates the stock removal. When stock removal is completed, the flow of colloidal silica slurry and alkaline etchant is stopped. The wafer is then treated with an acidic quench solution followed by a water wash and rinse. Afterwards, the polisher arm is raised and the ceramic block is demounted, water rinsed and transferred to a finish polisher.

During the finish polishing process, the ceramic block is mounted onto the finish polisher arm which is lowered onto a soft polyurethane pad on a ceramic turntable. The turntable is rotated while an ammonia stabilized colloidal silica slurry and an alkaline etchant are dispensed onto the pad. The surface of the wafer is finish polished at about five lb/in$^2$ of silicon and 30°–37° C. for four to six minutes to remove 0.2–0.5 μm of silicon (Si <100>) from the surface of the wafer. The colloidal silica slurry and alkaline etchant are then discontinued. The wafer is treated with the acidic quench solution described above and water rinsed. The polisher arm is raised and the ceramic block is demounted. The wafer is water rinsed and demounted from the block before it is stored in a Teflon cassette and transported for cleaning.

Silicon wafers that are polished using the two step method have greater surface roughness and haze than wafers that have been polished using a three step method. In the three step method, the wafers are subjected to an intermediate polish before being finish polished. The intermediate polish is performed to provide a smoother wafer by further reducing the low frequency component of roughness. Stock removal of 15–20 μm silicon <100> is accomplished in twenty minutes at 35°–45° C. and 4.3–5.7 lb/in$^2$ when the turntable is rotated and a sodium stabilized colloidal silica slurry is applied to the wafer. After a wafer is quenched and water rinsed, the ceramic block is demounted and transferred to another polishing machine for intermediate stock removal. The intermediate polishing is performed using a softer pad at a lower pressure of 2.1–2.8 lb/in$^2$ and a lower temperature of 28°–32° C. to remove 2–4 μm silicon <100> in ten minutes. The wafer is quenched and water rinsed before the ceramic block is demounted and transferred to the finish polisher. The wafer is finish polished for 8–10 minutes on a high nap pad (28°–32° C., 1.4 lb/in$^2$, 30 rpm) using an ammonia stabilized colloidal silica slurry to render a haze free wafer surface. The wafer is then treated with an acidic quench solution and water rinsed. After the polisher arm is raised and the ceramic block is demounted, the wafer is water rinsed, demounted from the block, stored and transported for cleaning.

The three step polishing method improves the surface roughness and haze of the polished wafer. A disadvantage associated with the three step process, however, is the additional cost of the intermediate polisher and the complexity of adding an additional polishing operation to the process.

There is a need for a simple, economical rough polishing method that can provide wafers having less surface roughness.

SUMMARY OF THE INVENTION

It is a primary object of the present invention to provide a method of rough polishing a semiconductor wafer which improves the surface roughness of the wafer without diminishing the throughput for the process. In this connection, a related object of this invention is to provide improved surface roughness on the wafer surface when stock removal is completed and to provide a wafer that will exhibit reduced haze when it is finish polished.

It is another object of this invention to provide a simple, economical method of rough polishing a semiconductor wafer which does not require transfer of the wafer to another polisher to complete the stock removal phase.

Other objects and advantages of the invention will be apparent from the following detailed description.

In accordance with the present invention the foregoing objectives are realized by providing a method of rough polishing a semiconductor wafer to reduce roughness on a surface of the wafer prior to finish polishing the wafer, by applying a polishing solution to a polishing material, contacting the polishing material and the polishing solution with the surface of the wafer as the wafer moves relative to the polishing material to reduce low frequency surface roughness of the wafer, applying a second polishing solution to the polishing material, and contacting the polishing material and the second polishing solution with the surface of the wafer as the wafer moves relative to the polishing material to further reduce the low frequency surface roughness, wherein the wafer has an average surface roughness not greater than 1.0 nm Ra, as measured on a 1 mm×1 mm scan with an optical interferometer, after being rough polished.

In a preferred embodiment, the semiconductor wafer is composed of silicon. The polishing solution includes a sodium stabilized colloidal silica slurry and an alkaline etchant. An ammonia stabilized colloidal silica slurry and an alkaline etchant are included in the second polishing solution. A hard polyurethane impregnated pad is used as the polishing material. Preferably, the low frequency surface roughness is reduced to no greater than 2.0 nm Ra in the first rough polishing step and is further reduced to no greater than 1.0 nm Ra in the second polishing step.

The method can include the step of applying an acidic solution to the wafer and then rinsing the wafer with water to quench the second polishing solution after rough polishing the wafer. The wafer preferably is not treated with an acidic solution or rinsed with water before the second solution is applied to the polishing material.

The alkaline etchant is preferably an amine reinforced caustic solution having a pH ranging from about 11 to 14. A preferred etchant includes potassium hydroxide and ethylene diamine. A preferred acidic solution contains an organic or inorganic acid and a polyether polyol.

DETAILED DESCRIPTION OF THE PREFERRED EMBODIMENTS

Figure 1:
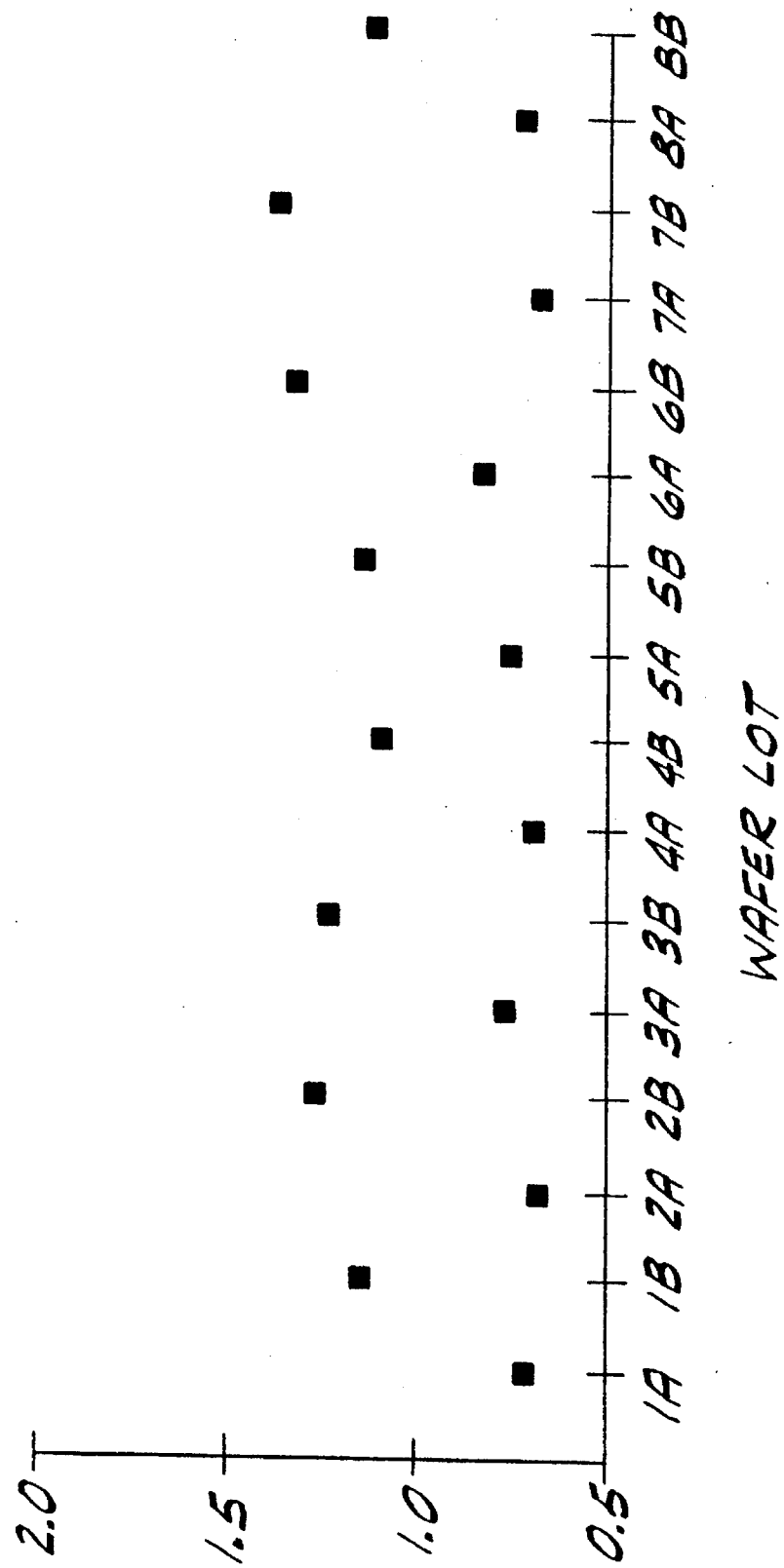
FIG. 1 graphically illustrates the average roughness of each lot of the polished wafers wherein wafers polished by the method of the present invention are designated 1A–8A and conventionally polished wafers are designed 1B–8B.

In accordance with the present invention it has been discovered that a semiconductor wafer can be polished using a two step stock removal phase on the same polisher before finish polishing the wafer. The resultant polished semiconductor wafer has less surface roughness than a conventional wafer and can be polished as quickly. The wafers rough polished by the method of the present invention exhibit an average surface roughness of less than 1.0 nm Ra as measured on a 1 mm×1 mm scan with an optical interferometer.

The polishing times indicated below are appropriate for p-type semiconductor wafers composed of silicon having a <100> crystal orientation. If silicon having a <111> orientation is used, the silicon will be more difficult to polish and will require longer polishing times. Silicon having a <110> orientation is more readily polished than silicon <100> and will require shorter polishing times. An $n^-$-type wafer will also require shorter polishing times because it etches faster than p-type wafers. However, the polishing time will be longer for an $n^+$-type wafer because it etches more slowly.

The present invention is directed to a method of rough polishing semiconductor wafers, such as silicon wafers, prior to finish polishing the wafers. Before a silicon wafer is rough polished, it is wax bonded to a ceramic polishing block which is then mounted on the arm of the rough polisher. As the rough polishing begins, the polisher arm is lowered until it comes into contact with a hard pad on the ceramic turntable of the polisher. The turntable is then rotated while a sodium stabilized colloidal silica slurry and an alkaline etchant are dispensed onto the pad surface. The surface of the wafer is rough polished at about 9 lb/in$^2$ and about 50°–55° C. for about 400 to about 600 seconds for a p-type wafer. This first rough polishing removes from about 16 to about 18 µm of silicon (Si <100>) from the surface of the wafer and reduces the low frequency surface roughness of the wafer to no greater than 2.0 nm Ra. Preferably, the low frequency surface roughness is reduced to about 1.2 nm Ra to 2.0 nm Ra in this polishing step. For purposes of the present invention, low frequency surface roughness as observed with a Nomarski microscope at 50× magnification or with a Wyko-2D microscope equipped with a 10× magnification head is in a lateral bandwidth of from 100µ to 1 mm with a vertical peak to valley measurement not exceeding 15 nm. High frequency surface roughness is haze as measured by a light scattering instrument or an AFM in a lateral bandwidth of from 1µ to 10µ with a vertical peak to valley measurement not exceeding 3 nm.

Sodium stabilized colloidal silica slurries are well known in the art, and have been described in U.S. Pat. No. 3,170,273. Syton HT-50, a preferred sodium stabilized slurry commercially available from E.I. du Pont de Nemours & Company, has a silica content of 49.2–50.5% and a particle size of 35–50 µm. The sodium stabilized colloidal silica slurry is dispensed at a flow rate of from about 50 to about 80 ml/min.

The alkaline etchant is preferably an amine reinforced caustic solution having a pH ranging from about 11 to 14. A suitable etchant solution can include from about 1.0 to about 1.5 wt. % potassium hydroxide, from about 0.5 to about 1.3 wt. % ethylene diamine and a remainder of distilled water. The alkaline etchant flow typically begins about 12 seconds after the colloidal silica slurry flow is initiated, and continues for about 60 seconds after the colloidal silica slurry flow is discontinued. Alkaline etchant is provided at a flow rate ranging from about 80 to about 120 ml/min. Although use of an alkaline etchant is not required after stock removal, there is a high variance in stock removal between wafers that are polished on the same rough polisher without an alkaline etchant.

The sodium stabilized colloidal silica slurry and alkaline etchant are preferably dispensed onto a hard polyurethane impregnated felt pad, such as a Suba H2 pad which is commercially available from Rodel of Scottsdale, Ariz. Appropriate polishing pads for use in rough polishing or finish polishing are well known in the art.

When the sodium stabilized colloidal silica slurry is discontinued, an ammonia stabilized colloidal silica slurry is immediately introduced onto the hard pad for about 60 to about 150 seconds at about 9 lb/in$^2$ and about 59°–60° C. This second rough polishing step removes from about 2 to about 4 µm silicon <100> from the wafer surface and further reduces low frequency surface roughness to not greater than 1.0 nm Ra. Preferably, the low frequency surface roughness is reduced to about 0.5 to about 0.8 nm Ra.

The slurry used in this second step of the rough polishing phase is applied to the wafer in conjunction with the alkaline etchant for about 60 seconds. The etchant flow is then suspended to minimize degradation of the wafer surface that can be caused by the etchant. The slurry can continue to be dispensed for up to about 90 seconds. A longer slurry application time is preferred for $p^+$-type wafers, while a median application time is appropriate for $p^-$-type wafers. If the slurry is dispensed for less than 60 seconds, the slurry will have a negligible effect on the roughness of the wafer.

The continued use of the same hard pad during the second step of the rough polishing phase does not accelerate degradation of the pad or reduce the quality of the polished wafer. The second rough polishing step further reduces the low frequency component of surface roughness to provide a smoother wafer as compared to a wafer subjected to the rough polishing step of the conventional two step process.

A preferred ammonia stabilized colloidal silica slurry is Glanzox 3900, which is commercially available from Fujimi Incorporated of Aichi Pref. 452, Japan. Glanzox 3900 has a silica content of from about 8 to about 10% and a particle size of from about 0.025 to about 0.035 μm. If the ammonia stabilized silica slurry is not diluted prior to use, the polished wafer will not be as smooth as a wafer treated with a diluted slurry. However, the wafer will be smoother than a wafer that was rough polished using a conventional two step method. If the slurry is too dilute, it will fail to mechanically abrade the wafer surface. A dilution of about one part silica slurry to about ten parts distilled water is preferred. The slurry is preferably dispensed at a rate of about 150 to about 250 ml/min as a solution of one part silica slurry to ten parts water.

When the ammonia stabilized slurry application has been completed, the rough polishing phase is complete. The wafer is then treated with an acidic quench solution for about 10 to about 40 seconds to neutralize the alkaline etchant and slurry that was applied to the wafer. The wafer is also rinsed with water for about 10 to about 30 seconds at a flow rate of from about 100 to about 1000 ml/min. The acidic quench solution and the water rinse can be applied simultaneously or sequentially. The polisher arm is then raised and the ceramic block is demounted, water rinsed and transferred to a finish polisher.

The acidic quench solution includes a polyether polyol having an average molecular weight of from about 100,000 to about 1,000,000 and an organic or inorganic acid or a mixture thereof. A representative quench solution is composed of from about 0.01 to about 0.1 wt. % polyether polyol, from about 0.2 to about 0.5 wt. % isopropanol, from about 0.5 to about 5.0 wt. % hydrogen peroxide in distilled water, adjusted to a pH of from about 3.4 to about 3.6 with acetic acid or sulfuric acid. A suitable polyether polyol is Polyox WSR N-3000, a water soluble resin commercially available from Union Carbide and having a molecular weight of about 400,000. The acidic quench solution is dispensed at a flow rate of from about 400 to about 800 ml/min.

The rough polished wafers can then be finish polished using the method of the conventional two step process discussed above. However, it is preferable to shorten the finish polishing time to compensate for the additional polishing time required for the second step of the rough polishing phase. A $p^+$-type wafer is typically finish polished for about 300 seconds, followed by a quench phase. A finish polishing time of about 240 seconds is conventional for a $p^-$-type wafer.

A silicon wafer is finish polished by first mounting the ceramic block onto the finish polisher arm, lowering the arm onto a soft pad on a ceramic turntable, and rotating the turntable while an ammonia stabilized colloidal silica slurry and alkaline etchant are dispensed under relatively low temperature and pressure. The surface of the wafer is typically finish polished at about five lb/in$^2$ and 30°–37° C. to remove from about 0.2 to about 0.5 μm of silicon <100> from the surface of the wafer. The finish polishing phase can be completed by applying the acidic quench solution and water rinse solution to the wafer. The polisher arm is raised and the ceramic block is demounted. The wafer is water rinsed and demounted from the block before it is stored in a Teflon cassette and transported for cleaning.

Any polisher typically used in the semiconductor industry can be used in practicing the method of the present invention. Suitable commercially available polishers are manufactured by Speedfam, R.H. Strausburgh and Westech Systems. The operating conditions, such as the polishing time, pressure and temperature will vary depending upon the polisher that is used.

The following example is presented to describe preferred embodiments and utilities of the present invention and is not meant to limit the present invention unless otherwise stated in the claims appended hereto.

EXAMPLE 1

Five lots of $p^-$-type wafers and three lots of $p^+$-type wafers were polished using the conventional two step polishing method on MEMC Mark IX polishers. The wafers (200 mm) were polished by two rough polishers and one finish polisher. These polishers were then modified for use with the method of the present invention and five lots of $p^-$-type wafers and three lots of $p^+$-type wafers were polished. The fluid flow rate settings for the rough polishers and finish polishers were the same for the conventional method and the method of the invention. The following fluid flow rate settings were used for rough polishing:

| Fluid | Rough Polishing Flow Rate Settings (ml/min) |
| --- | --- |
| Syton HT-50 | 50–80 |
| Glanzox (1:10 dilution of Glanzox:water) | 200 |
| KOH/EDA Etchant | 80–120 |
| Polyox Acid Quench | 800 |
| Distilled Water Rinse | 1000 |
| Hub Spray | 10–15 |

The wafers polished using the conventional two step method were rough polished for about 8 minutes with Syton HT-50 at about nine lb/in$^2$ and 50° to 55° C. The wafers were then quenched for about 40 seconds and simultaneously water rinsed for about 30 seconds before being transferred to the finish polisher. The $p^+$-type wafers were finish polished with Glanzox 3900 for about 300 seconds, and the $p^-$-type wafers were polished for about 240 seconds at operating conditions of about five lb/in$^2$ and 30°–37° C. The wafers were quenched for about 60 seconds and simultaneously water rinsed for about 30 seconds. Suba H2 and Politex pads were used for the rough polish and finish polish phases, respectively.

The wafers polished using the method of the present invention were rough polished for about 400 seconds with Syton HT-50 at about nine lb/in$^2$ and 50° to 55° C. The flow of Syton HT-50 was then discontinued and the flow was switched to Glanzox 3900. The wafers were polished for about 120 seconds with Glanzox 3900 at 59°–60° C. using the same pressure and polishing pad. After rough polishing, the wafers were quenched for about 40 seconds and simultaneously water rinsed for about 30 seconds before being transferred to the finish polisher. The wafers were finish polished by the same procedure used for the conventionally polished wafers.

The roughness of six wafers from each lot was measured using a Wyko-2D microscope equipped with a 10× magnification head. Five areas of each wafer were measured, four being along a perimeter of about two to three cm from the wafer edge and one being at the center of the wafer.

FIG. 1 illustrates the average roughness of each lot of the polished wafers wherein wafers polished by the method of the present invention are designated 1a–8a and conventionally polished wafers are designed 1b–8b. Lots 5, 6 and 8 were p$^+$-type wafers while the remaining lots were p$^-$-type wafers. FIG. 1 indicates that the wafers polished by the method of the invention were consistently smoother than the conventionally polished wafers. The average roughness of wafers of the invention was approximately 0.72 nm Ra, nearly half the average roughness of the conventionally polished wafers (approximately 1.3 nm Ra). When some of these wafers were coated with an epitaxial layer, the epitaxial layer was also consistently smoother for the wafers polished by the method of the invention.

Figure 2:
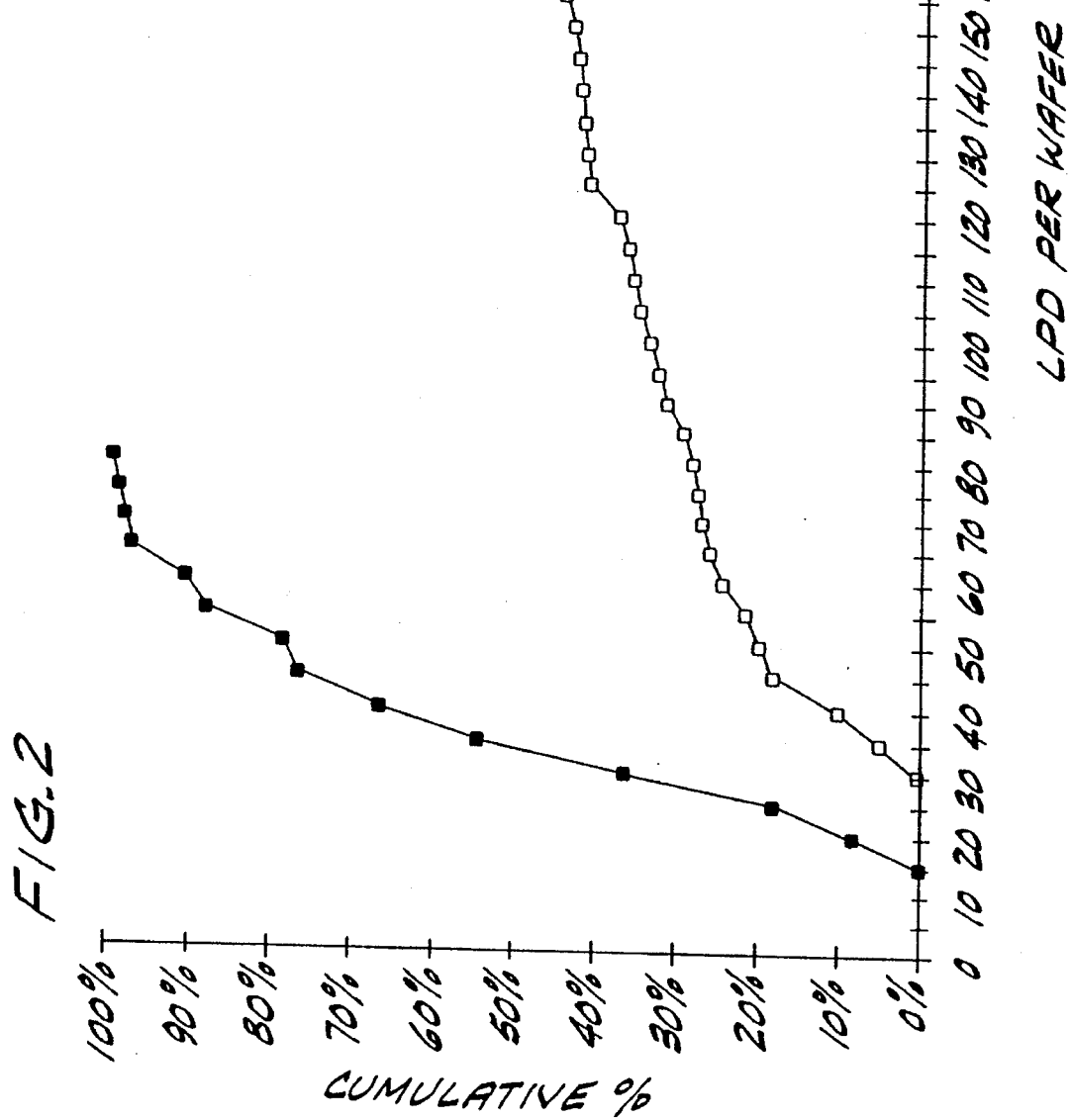
FIG. 2 illustrates the amount of light point defects (LPD) per wafer of a size greater than 0.15µ wherein □ represents wafers that are conventionally polished and ■ represents wafers rough polished by the method of the invention.
Figure 3:
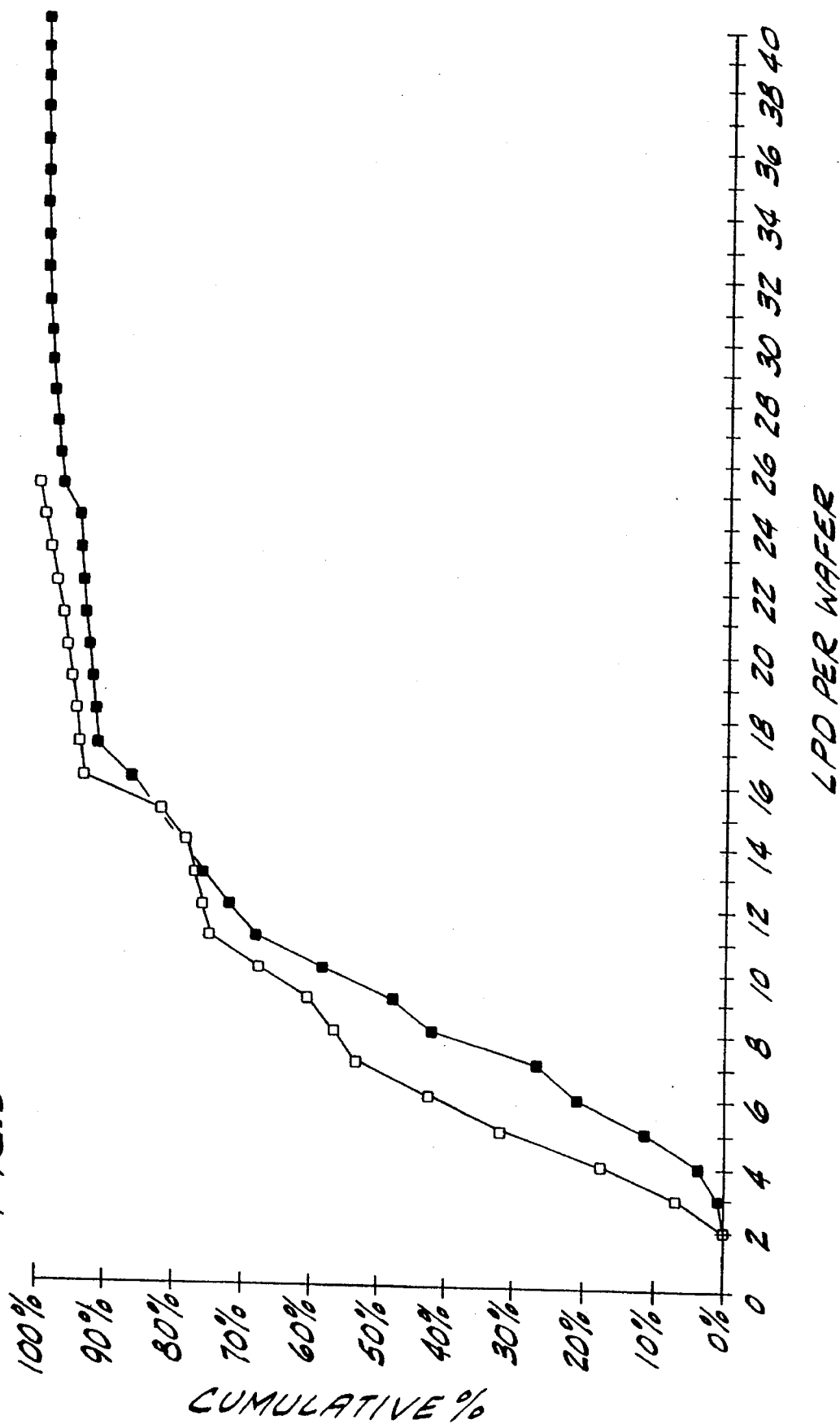
FIG. 3 depicts the number of LPD per wafer of a size greater than 0.15 µ wherein the wafer is coated with an epitaxial layer and wherein ■ represents wafers that are conventionally polished and □ represents wafers rough polished by the method of the invention.

P$^+$-type wafers in one lot were also inspected to determine the particle defects on their surface as measured with a Tencor 6200. FIG. 2 illustrates the amount of light point defects (LPD) per wafer ranging in size from greater than 0.15 μm to less than 0.2 μm. The mean for the wafers polished by the method of the invention was about 33 LPD as compared to about 175 LPD per conventionally polished wafer. Wafers that were coated with an epitaxial layer were also subjected to LPD testing as shown in FIG. 3. The mean for the conventionally polished wafers was about 9 LPD per wafer. The wafers polished by the method of the invention has a mean LPD of about 7 per wafer.

The mean LPD for wafers polished by the inventive process is less than that of conventionally polished wafers for a range of particle defect sizes as indicated in table 1 below.

TABLE 1

| | Mean LPD for wafers polished by the method of the invention | Mean LPD for conventionally polished wafers |
| --- | --- | --- |
| 0.1 μm < LPD < 0.2 μm | 360 | 499 |
| LPD > 0.2 μm | 8.9 | 13.2 |
| haze | 307 | 314 |

In these tests, 133 wafers of the invention and 637 conventionally polished wafers were considered. The haze was comparable for both methods.

While the invention is susceptible to various modifications and alternative forms, specific embodiments thereof have been shown by way of example and were herein described in detail. It should be understood, however, that it is not intended to limit the invention to the particular form disclosed, but on the contrary, the intention is to cover all modifications, equivalents and alternatives falling within the spirit and scope of the invention as defined by the appended claims.

I claim:

1. A method of rough polishing a semiconductor wafer to reduce roughness on a surface of the wafer prior to finish polishing the wafer, the method comprising the steps of:
   (a) applying a first polishing solution to a polishing material;
   (b) contacting the polishing material and the first polishing solution with the surface of the wafer as the wafer moves relative to the polishing material to reduce low frequency surface roughness of the wafer;
   (c) applying a second polishing solution containing an ammonia stabilized colloidal silica slurry to the polishing material; and
   (d) contacting the polishing material and the second polishing solution with the surface of the wafer as the wafer moves relative to the polishing material to further reduce the low frequency surface roughness, wherein the wafer has an average surface roughness not greater than 1.0 nmRa, as measured on a 1 mm×1 mm scan with an optical interferometer, after being rough polished.

2. The method of claim 1 wherein the low frequency surface roughness is reduced to no greater than 2.0 nm Ra in step (b) and is further reduced to no greater than 1.0 nm Ra in step (d).

3. The method of claim 1 wherein the first polishing solution includes a sodium stabilized colloidal silica slurry.

4. The method of claim 1 wherein the first polishing solution or the second polishing solution includes an alkaline etchant.

5. The method of claim 1 wherein the polishing material is a hard polyurethane impregnated pad.

6. The method of claim 1 further including the step of applying an acidic solution to the wafer and rinsing the wafer with water to quench the second polishing solution after rough polishing the wafer.

7. The method of claim 1 wherein the wafer is not treated with an acidic solution or rinsed with water before the second solution is applied to the polishing material.

8. The method of claim 3 wherein the alkaline etchant is an amine reinforced caustic solution having a pH of about 11 to 14.

9. The method of claim 8 wherein the amine reinforced caustic solution contains potassium hydroxide and ethylene diamine.

10. The method of claim 4 wherein the alkaline etchant is an amine reinforced caustic solution having a pH of about 11 to 14.

11. The method of claim 10 wherein the solution contains potassium hydroxide and ethylene diamine.

12. The method of claim 6 wherein the acidic solution contains an organic or inorganic acid and a polyether polyol.

13. The method of claim 1 wherein the semiconductor wafer is a silicon wafer.

14. The method of claim 1 wherein the low frequency surface roughness is reduced to about 1.2 nm Ra to about 2.0 nm Ra in step (b) and is further reduced to about 0.5 nm Ra to about 0.8 nm Ra in step (d).

15. The method of claim 13 wherein from about 16 μm to about 18 μm of silicon are removed during step (b) and from about 2 μm to about 4 μm of silicon are removed during step (d).

16. A method of rough polishing a semiconductor wafer to reduce roughness on a surface of the wafer prior to finish polishing the wafer, the method comprising the steps of:

(a) applying a first solution to a hard polishing pad;

(b) contacting the polishing pad and the first solution with the surface of the wafer as the wafer moves relative to the polishing pad to reduce low frequency surface roughness of the wafer to no greater than 2.0 nm Ra;

(c) then applying a second solution containing an ammonia stabilized silica slurry to the polishing pad; and (d) then contacting the polishing pad and the second solution with the surface of the wafer as the wafer moves relative to the polishing pad to further reduce the low frequency surface roughness to no greater than 1.0 nm Ra, the surface roughness being measured on a 1 mm×1 mm scan with an optical interferometer.

17. The method of claim 16 wherein the first solution includes a sodium stabilized colloidal silica slurry.

18. The method of claim 16 wherein the hard polishing pad is a polyurethane impregnated pad.

19. The method of claim 16 further including the step of applying an acidic solution to the wafer and rinsing the wafer with water to quench the second solution after rough polishing the wafer.

20. The method of claim 16 wherein the wafer is not treated with an acidic solution or rinsed with water before the second solution is applied to the polishing material.

21. The method of claim 17 wherein the first solution or the second solution further includes an alkaline etchant.

22. The method of claim 21 wherein the alkaline etchant is an amine reinforced caustic solution having a pH of about 11 to 14.

23. The method of claim 22 wherein the alkaline etchant contains potassium hydroxide, ethylene diamine and water.

24. The method of claim 19 wherein the acidic solution contains a polyether polyol, isopropanol, hydrogen peroxide and acetic or sulfuric acid.

25. The method of claim 16 wherein the semiconductor wafer is a silicon wafer.

26. The method of claim 16 wherein the low frequency surface roughness is reduced to about 1.2 nm Ra to about 2.0 nm Ra in step (b) and is further reduced to about 0.5 nm Ra to about 0.8 nm Ra in step (d).

27. The method of claim 25 wherein from about 16 μm to about 18 μm of silicon are removed during step (b) and from about 2 μm to about 4 μm of silicon are removed during step (d).

28. A method of rough polishing a semiconductor wafer to reduce roughness on a surface of the wafer prior to finish polishing the wafer, the method comprising the steps of:

(a) applying a first polishing solution to a polishing material;

(b) contacting the polishing material and the first polishing solution with the surface of the wafer as the wafer moves relative to the polishing material to reduce low frequency surface roughness of the wafer;

(c) applying a second polishing solution to the polishing material, the second polishing solution containing an ammonia stabilized colloidal silica slurry and an alkaline etchant; and (d) contacting the polishing material and the second polishing solution with the surface of the wafer as the wafer moves relative to the polishing material to further reduce the low frequency surface roughness, wherein the wafer has an average surface roughness not greater than 1.0 nm Ra, as measured on a 1 mm×1 mm scan with an optical interferometer, after being rough polished.

29. A method of polishing a semiconductor wafer to reduce roughness on a surface of the wafer, the method comprising the steps of: (a) applying a first polishing solution to a polishing pad;

(b) contacting the polishing pad and the first solution with the surface of the wafer as the wafer moves relative to the polishing pad;

(c) applying a second polishing solution containing an ammonia stabilized silica slurry to the polishing pad; and (d) contacting the polishing pad and the second solution with the surface of the wafer as the wafer moves relative to the polishing pad.

30. The method of claim 29 wherein the first polishing solution includes a sodium stabilized colloidal silica slurry.

31. The method of claim 30 wherein the first polishing solution or the second polishing solution includes an alkaline etchant.

32. The method of claim 29 further including the step of applying an acidic solution to the wafer and rinsing the wafer with water to quench the second polishing solution after polishing the wafer.

33. The method of claim 29 wherein the wafer is not treated with an acidic solution or rinsed with water before the second solution is applied to the polishing material.

34. The method of claim 31 wherein the alkaline etchant is an amine reinforced caustic solution having a pH of about 11 to 14.

35. The method of claim 34 wherein the amine reinforced caustic solution contains potassium hydroxide and ethylene diamine.

36. The method of claim 33 wherein the acidic solution contains an organic or inorganic acid and a polyether polyol.

37. The method of claim 29 wherein the semiconductor wafer is a silicon wafer.

* * * * *

UNITED STATES PATENT AND TRADEMARK OFFICE
CERTIFICATE OF CORRECTION

PATENT NO. : 5,571,373

DATED : November 5, 1996

INVENTOR(S) : Vepa Krishna, Michael S. Wisnieski and Lois Illig

It is certified that error appears in the above-identified patent and that said Letters Patent is hereby corrected as shown below:

In claim 1, column 8, line 23, "1.0 nmRa" should read --1.0 nm Ra--.

Signed and Sealed this

Seventeenth Day of June, 1997

Attest:

Attesting Officer

BRUCE LEHMAN

Commissioner of Patents and Trademarks